United States Patent
Sakaguchi et al.

(10) Patent No.: US 8,257,908 B2
(45) Date of Patent: *Sep. 4, 2012

(54) COATING-TYPE UNDERLAYER COATING FORMING COMPOSITION FOR LITHOGRAPHY CONTAINING VINYLNAPHTHALENE RESIN DERIVATIVE

(75) Inventors: Takahiro Sakaguchi, Toyoma (JP); Tomoyuki Enomoto, Toyoma (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 97 days.

This patent is subject to a terminal disclaimer.

(21) Appl. No.: 11/990,855

(22) PCT Filed: Aug. 15, 2006

(86) PCT No.: PCT/JP2006/316042
§ 371 (c)(1),
(2), (4) Date: Feb. 22, 2008

(87) PCT Pub. No.: WO2007/023710
PCT Pub. Date: Mar. 1, 2007

(65) Prior Publication Data
US 2009/0253076 A1    Oct. 8, 2009

(30) Foreign Application Priority Data

Aug. 25, 2005    (JP) ................................ 2005-243601

(51) Int. Cl.
G03F 7/20 (2006.01)
G03F 7/30 (2006.01)
G03F 7/36 (2006.01)

(52) U.S. Cl. ........ 430/311; 430/313; 430/316; 430/317; 430/318; 430/323; 430/325; 430/326

(58) Field of Classification Search .................. None
See application file for complete search history.

(56) References Cited

U.S. PATENT DOCUMENTS

| | | | |
|---|---|---|---|
| 5,693,691 A | 12/1997 | Flaim et al. | |
| 5,919,599 A | 7/1999 | Meador et al. | |
| 2004/0058272 A1 * | 3/2004 | Takahashi et al. | 430/270.1 |
| 2005/0003299 A1 | 1/2005 | Adegawa | |
| 2007/0238029 A1 * | 10/2007 | Takei et al. | 430/5 |

FOREIGN PATENT DOCUMENTS

| | | |
|---|---|---|
| JP | A-2004-205658 | 7/2004 |
| JP | A-2004-271838 | 9/2004 |
| JP | A-2005-031445 | 2/2005 |
| JP | A-2005-049810 | 2/2005 |
| JP | A-2005-084621 | 3/2005 |
| JP | A-2005-179461 | 7/2005 |
| WO | WO2006/003850 A1 * | 1/2006 |

OTHER PUBLICATIONS

Lynch et al., "Properties and Performance Near UV Reflectivity Control Layers," *Proceedings of SPIE*, vol. 2195, pp. 225-229, (1994).

Taylor et al., "Methacrylate Resist and Antireflective Coatings for 193 nm Lithography," *Proceedings of SPIE*, vol. 3678, pp. 174-185 (1999).

Meador et al., "Recent Progress in 193 nm Antireflective coatings," *Proceedings of SPIE*, vol. 3678, pp. 800-809 (1999).

* cited by examiner

*Primary Examiner* — Sin J. Lee
(74) *Attorney, Agent, or Firm* — Oliff & Berridge, PLC

(57) ABSTRACT

[Object] To provide a coating-type underlayer coating forming composition that is applied for multi-ply coating process by thin film resist in order to prevent collapse of resist pattern after development with miniaturization of resist pattern, and that shows a sufficient etching resistance against a semiconductor substrate to be processed on processing of the substrate by having a low dry etching rate compared with the photoresist and substrate.

[Means for solving problems] A coating-type underlayer coating forming composition that is used for lithography process by multi-ply coating, comprising a polymer containing a vinylnaphthalene based structural unit and an acrylic acid based structural unit containing an aromatic hydroxy group or a hydroxy-containing ester. A coating-type underlayer coating forming composition further comprising an acrylic acid based structural unit containing an aliphatic cyclic compound-containing ester or an aromatic compound-containing ester.

20 Claims, No Drawings

COATING-TYPE UNDERLAYER COATING FORMING COMPOSITION FOR LITHOGRAPHY CONTAINING VINYLNAPHTHALENE RESIN DERIVATIVE

TECHNICAL FIELD

The present invention relates to a coating-type underlayer coating forming composition for lithography that is effective on processing of semiconductor substrates, and a method for forming photoresist pattern by use of the coating-type underlayer coating forming composition.

BACKGROUND ART

Conventionally, in the manufacture of semiconductor devices, micro-processing by lithography using a photoresist composition has been carried out. The micro-processing is a processing method comprising forming a thin film of a photoresist composition on a substrate to be processed, such as a silicon wafer or the like, irradiating actinic rays such as ultraviolet rays through a mask pattern on which a pattern for a semiconductor device is depicted, developing it to obtain a photoresist pattern, and etching the substrate to be processed, such as a silicon wafer or the like by use of the photoresist pattern as a protective film. However, in recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of random reflection and standing wave of actinic rays from a substrate have become serious problems. Accordingly, it has been widely studied to provide an anti-reflective coating between the photoresist and the substrate to be processed (Bottom Anti-Reflective Coating, BARC).

As the anti-reflective coating, inorganic anti-reflective coatings made of titanium, titanium dioxide, titanium nitride, chromium oxide, carbon or a-silicon, etc., and organic anti-reflective coatings made of a light absorbing substance and a high molecular compound are known. The former requires an installation such as a vacuum deposition apparatus, a CVD (chemical vapor deposition) apparatus or a sputtering apparatus, etc. In contrast, the latter is considered advantageous in that it requires no special installation so that many studies have been made. For example, mention may be made of a novolak resin type anti-reflective coating and an acrylic resin type anti-reflective coating which have a hydroxyl group being a crosslinking reaction group and a light absorbing group in the same molecule (see, for example Patent Documents 1 and 2).

A pattern forming method is disclosed, in which a resist underlayer coating material is improved in etching resistance in substrate processing by using a polymer containing a styrene derivative or a vinylnaphthalene derivative for a resist underlayer coating (see, for example Patent Document 3).

The physical properties desired for organic anti-reflective coating materials include high absorbance to light and radioactive rays, no intermixing with a layer applied on the anti-reflective coating (being insoluble in a solvent used for materials applied on the anti-reflective coating), no diffusion of low molecular substances from the anti-reflective coating materials into the topcoat resist on applying or drying with heat, and a higher dry etching rate than the photoresist (see, for example, Non-patent Documents 1, 2 and 3).

When miniaturization of resist pattern progresses in future, problems such as a low resolution and collapse of resist pattern after development occur, and thus it is desired to make photoresists thinner. Therefore, it is difficult to obtain a film thickness of resist pattern sufficient for the processing of substrates, and processes for providing a function as a mask in the substrate processing not only for resist pattern but also for coating-type underlayer coating formed between a resist and a semiconductor substrate to be processed become required. As the coating-type underlayer coating for such a process, a coating-type underlayer coating for lithography having a selection ratio of dry etching rate close to that of photoresists, a coating-type underlayer coating for lithography having a lower selection ratio of dry etching rate than that of photoresists, or a coating-type underlayer coating for lithography having a lower selection ratio of dry etching rate than that of semiconductor substrates, which is different from conventional high etch rate coating-type underlayers, becomes required. It is also able to confer anti-reflective performance to the coating-type underlayer coatings, and they can have the function of the conventional anti-reflective coatings together.

On the other hand, for obtaining fine resist pattern, it begins to use a process in which the resist pattern and the coating-type underlayer coating are made thinner on dry etching of coating-type underlayer coating than the width of pattern on the development of photoresists. As the coating-type underlayer coating for such a process, a coating-type underlayer coating having a selection ratio of dry etching rate close to that of photoresists which is different from conventional high etch rate anti-reflective coatings, becomes required. It is also able to confer anti-reflective performance to the coating-type underlayer coatings, and they can have the function of the conventional anti-reflective coatings together.

Patent Document 1: U.S. Pat. No. 5,919,599
Patent Document 2: U.S. Pat. No. 5,693,691
Patent Document 3: JP-A 2004-271838
Non-patent Document 1: Tom Lynch et al., "Properties and Performance of Near UV Reflectivity Control Layers", US, in Advances in Resist Technology and Processing XI, Omkaram Nalamasu ed., Proceedings of SPIE, 1994, Vol. 2195, p. 225-229
Non-patent Document 2: G. Taylor et al., "Methacrylate Resist and Antireflective Coatings for 193 nm Lithography", US, in Microlithography 1999: in Advances in Resist Technology and Processing XVI, Will Conley ed., Proceedings of SPIE, 1999, Vol. 3678, p. 174-185
Non-patent Document 3: Jim D. Meador et al., "Recent Progress in 193 nm Antireflective Coatings, US, in Microlithography 1999: in Advances in Resist Technology and Processing XVI, Will Conley ed., Proceedings of SPIE, 1999, Vol. 3678, p. 800-809

DISCLOSURE OF INVENTION

Problem to be solved by the Invention

An object of the present invention is to provide a coating-type underlayer coating forming composition that is used for lithography process in the production of semiconductor devices. Another object of the present invention is to provide a coating-type underlayer coating for lithography having a selection ratio of dry etching rate close to that of photoresists, a coating-type underlayer coating for lithography having a lower selection ratio of dry etching rate than that of photoresists, or a coating-type underlayer coating for lithography having a lower selection ratio of dry etching rate than that of semiconductor substrates, that causes no intermixing with photoresist layers and provides excellent photoresist pattern. In addition, the present invention can confer a property for absorbing effectively reflection light from substrates in a case where irradiation light having a wavelength of 248 nm, 193 nm, 157 nm or the like is used in the microprocessing. Further, an object of the present invention is to provide a method for forming a photoresist pattern, in which the coating-type underlayer coating forming composition is used.

Means for Solving the Problem

The present invention relates to the following aspects:

as a first aspect, a coating-type underlayer coating forming composition that is used for lithography by multi-ply coating, comprising a polymer containing a structural unit of formula (1):

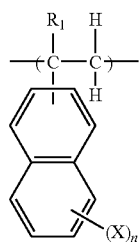

(1)

wherein $R_1$ is hydrogen atom or methyl group, X is a halogen atom, hydroxy group, an alkyl group, an alkoxy group, a thiol group, cyano group, carboxy group, an amino group, an amide group, an alkoxycarbonyl group, or a thioalkyl group on naphthalene ring, n is an integer of 0 to 7, when n is an integer other than 7, hydrogen atoms are present on residual positions, and a structural unit of formula (2):

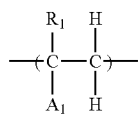

(2)

wherein $R_1$ is as defined in formula (1), $A_1$ is an organic group containing an aromatic hydroxy group or a hydroxy group-containing ester, in a molar ratio of 0.02 or more, respectively, based on all structural units constituting the polymer;

as a second aspect, the coating-type underlayer coating forming composition as described in the first aspect, wherein the polymer comprises further a structural unit of formula (3):

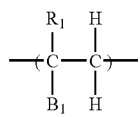

(3)

wherein $R_1$ is as defined in formula (1), $B_1$ is an organic group containing an aliphatic cyclic compound-containing ester or an aromatic compound-containing ester, in a molar ratio of 0.02 or more based on all structural units constituting the polymer;

as a third aspect, the coating-type underlayer coating forming composition as described in the first aspect, wherein the polymer comprises further a structural unit of formula (4):

(4)

wherein $R_1$ is as defined in formula (1), $B_2$ is a substituted or unsubstituted benzene ring or anthracene ring, in a molar ratio of 0.02 or more based on all structural units constituting the polymer;

as a fourth aspect, the coating-type underlayer coating forming composition as described in the first aspect, wherein the polymer contains the structural unit of formula (1) in a molar ratio of 0.4 to 0.98 and the structural unit of formula (2) in a molar ratio of 0.02 to 0.6, based on all structural units constituting the polymer:

as a fifth aspect, the coating-type underlayer coating forming composition as described in the second aspect, wherein the polymer contains the structural unit of formula (1) in a molar ratio of 0.4 to 0.96, the structural unit of formula (2) in a molar ratio of 0.02 to 0.58 and the structural unit of formula (3) in a molar ratio of 0.02 to 0.58, based on all structural units constituting the polymer:

as a sixth aspect, the coating-type underlayer coating forming composition as described in the third aspect, wherein the polymer contains the structural unit of formula (1) in a molar ratio of 0.4 to 0.96, the structural unit of formula (2) in a molar ratio of 0.02 to 0.58 and the structural unit of formula (4) in a molar ratio of 0.02 to 0-68, based on all structural units constituting the polymer:

as a seventh aspect, the coating-type underlayer coating forming composition as described in any one of the first to third aspects, wherein the structural unit of formula (1) is 2-vinylnaphthalene, or 2-isopropenylnaphthalene:

as an eighth aspect, the coating-type underlayer coating forming composition as described in any one of the first to third aspects, wherein the structural unit of formula (2) is $C_{1-10}$hydroxyalkylacrylate, or $C_{1-10}$hydroxyalkylmethacrylate:

as a ninth aspect the coating-type underlayer coating forming composition as described in the seventh aspect, wherein the structural unit of formula (2) is $C_{1-10}$hydroxyalkylacrylate, or $C_{1-10}$hydroxyalkylmethacrylate:

as a tenth aspect, the coating-type underlayer coating forming composition as described in any one of the seventh to ninth aspects, wherein the polymer contains the structural unit of formula (1) in a molar ratio of 0.9 and the structural unit of formula (2) in a molar ratio of 0.1, based on all structural units constituting the polymer:

as an eleventh aspect, the coating-type underlayer coating forming composition as described in any one of the first to third aspects, further comprising a crosslinking compound:

as a twelfth aspect, the coating-type underlayer coating forming composition as described in any one of the first to third aspects, further comprising an acid, an acid generator, or both of them:

as a thirteenth aspect, the coating-type underlayer coating forming composition as described in any one of the first to third aspects, further comprising a surfactant;

as a fourteenth aspect, an underlayer coating obtained by coating the coating-type underlayer coating forming composition as described in any one of the first to thirteenth aspects on a semiconductor substrate and baking it;

as a fifteenth aspect, a method for forming photoresist pattern for use in manufacture of semiconductor, comprising coating the coating-type underlayer coating forming composition as described in any one of the first to thirteenth aspects on a semiconductor substrate, and baking it to form an underlayer coating;

as a sixteenth aspect, a method for manufacturing semiconductor device comprising the steps of:
forming an underlayer coating from the coating-type underlayer coating forming composition as described in any one of the first to thirteenth aspects on a semiconductor substrate;
forming a resist coating on the coating-type underlayer coating;
forming a resist pattern by exposure to light and development;
etching the underlayer coating by use of the resist pattern to form a pattern; and
processing the semiconductor substrate by use of the patterned underlayer coating; and as a seventeenth aspect, a method for manufacturing semiconductor device comprising the steps of:
forming an underlayer coating from the coating-type underlayer coating forming composition as described in any one of the first to thirteenth aspects on a semiconductor substrate;
forming a hardmask on the coating-type underlayer coating;
forming a resist coating further thereon;
forming a resist pattern by exposure to light and development;
etching the hardmask by use of the resist pattern to form a pattern;
etching the underlayer coating by use of the patterned hardmask to form a pattern; and
processing the semiconductor substrate by use of the patterned underlayer coating.

Effect of the Invention

The present invention relates to a coating-type underlayer coating formed by use of a resin having a polymer of a vinylnaphthalene derivative in the main chain, and a coating-type underlayer coating forming composition for forming the coating-type underlayer coating.

The coating-type underlayer coating forming composition of the present invention can form a good pattern shape of photoresists without intermixing of the coating-type underlayer coating with the part applied thereon.

It is possible to confer a property for inhibiting effectively reflection from substrates on the coating-type underlayer coating forming composition of the present invention, and thus the coating-type underlayer coating can combine an effect as anti-reflective coating.

The coating-type underlayer coating forming composition of the present invention can provide excellent coating-type underlayer coatings that have a selection ratio of dry etching rate close to that of photoresists, a lower selection ratio of dry etching rate than that of photoresists, or a lower selection ratio of dry etching rate than that of semiconductor substrates.

In order to prevent collapse of resist pattern after development with miniaturization of resist pattern, it is performed to make photoresists thinner. The thin resists are required to be subjected to a process in which the resist pattern is transferred to the sublayer by etching process, and the substrate processing is performed by use of the sublayer as a mask, and a process in which the step comprising transferring the resist pattern to the sublayer by etching process, and transferring the pattern transferred to the sublayer to the layer applied below the sublayer with a different gas composition is repeated, and finally the substrate processing is performed. The coating-type underlayer coating and the composition for forming the same according to the present invention are effective for these processes. When the substrate processing is performed by use of the coating-type underlayer coating of the present invention, the coating-type underlayer coating has an etching resistance sufficiently against substrates to be processed (for example thermal silicon oxide coating, silicon nitride coating, polysilicon coating or the like on a substrate).

On the other hand, for obtaining fine resist pattern, it begins to be also used a process in which the resist pattern and the coating-type underlayer coating are made thinner on dry etching of coating-type underlayer coating than the width of pattern on the development of photoresists. The coating-type underlayer coating and the composition for forming the same according to the present invention are effective for this process, and has a selection property of dry etching rate close to that of photoresists.

Further, the coating-type underlayer coating of the present invention can be used as a planarizing (flattening) coating, a resist underlayer coating, an anti-contamination coating of photoresist layer, or a coating having a dry etching selectivity. The coating-type underlayer coating makes possible to form photoresist pattern in lithography process of the manufacture of semiconductor devices in an easy and precise manner.

BEST MODE FOR CARRYING OUT THE INVENTION

The coating-type underlayer coating forming composition of the present invention that is used in lithography process by multi-layer coating comprises a polymer and a solvent, and if necessary, a crosslinking agent, an acid, an acid generator, a surfactant, and the like. The composition contains a solid content being all components except the solvent in an amount of 0.1 to 70% by mass. In the solid content, the polymer is contained in an amount of 1 to 99% by mass.

The polymer used in the present invention has a weight average molecular weight of 100 to 1000000, preferably 1000 to 200000.

The present invention relates to a coating-type underlayer coating forming composition that is used in lithography process by multi-layer coating, and that comprises the structural units of formulae (1) and (2) in a molar ratio of 0.02 or more, preferably 0.05 or more, respectively, based on all structural units constituting the polymer. Hereinafter, the underlayer coating is referred to as coating-type underlayer coating for lithography. In the polymer containing the structural units of formulae (1) and (2), the sum of molar ratio of each structural unit is 1.00. It is required that the structural units of formulae (1) and (2) are contained in a molar ratio of 0.02 or more, preferably 0.05 or more, respectively, based on all structural units constituting the polymer. Other monomers can be copolymerized so long as they are monomers that are copolymerizable with the monomers having the structural units of formulae (1) and (2). In also this case, the sum of molar ratio of each structural unit is 1.00.

The above-mentioned polymers may be block copolymers, alternating copolymers, or random copolymers so long as the polymers have the structural units of formulae (1) and (2) in molar ratio that is required in the total polymer.

In the structural unit of formula (1), $R_1$ is hydrogen atom or methyl group, X is a halogen atom, hydroxy group, an alkyl group, an alkoxy group, a thiol group, cyano group, carboxy group, an amino group, an amide group, an alkoxycarbonyl group, or a thioalkyl group on naphthalene ring, n is an integer of 0 to 7, when n is an integer other than 7, hydrogen atoms are present on residual positions. The structural unit of formula (1) is preferably 2-vinylnaphthalene, or 2-isopropenylnaphthalene.

In the substituent X, as the halogen atom, fluorine atom, chlorine atom, bromine atom or iodine atom can be used. The alkyl group is straight-chain or branched $C_{1-6}$alkyl group that may be substituted with halogen atom or the like. For example, the alkyl group includes methyl group, ethyl group, propyl group, isopropyl group, butyl group, t-butyl group, n-hexyl group, chloromethyl group or the like. The alkoxy group is $C_{1-6}$alkoxy group, and for example includes methoxy group, ethoxy group, isopropoxy group or the like. The amide group is $C_{1-12}$amide group, and for example includes formamide group, acetamide group, propionamide group, isobutylamide group, benzamide group, naphthylamide group, acrylamide group or the like. The alkoxycarbonyl group is $C_{1-12}$alkoxycarbonyl group, and includes for example methoxycarbonyl group, ethoxycarbonyl group, benzyloxycarbonyl group or the like. The thioalkyl group is $C_{1-6}$thioalkyl group, and for example includes methylthio group, ethylthio group, butylthio group, hexylthio group or the like.

The structural unit of formula (1) in the polymer shows a high etching resistance on processing of the substrate that is present directly beneath, the structural unit of formula (2) forms a crosslink between hydroxy groups or with a crosslinking compound. The polymer containing the structural unit of formula (1) in a molar ratio of 0.4 to 0.98 and the structural unit of formula (2) in a molar ratio of 0.02 to 0.6, based on all structural units constituting the polymer, can have a lower selection ratio of dry etching rate than that of semiconductor substrates. Thus, dry etching resistance is improved.

As these structural units of formula (1), the followings are exemplified.

[1-1]

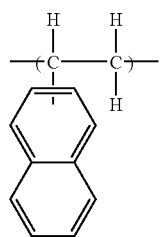

[1-2]

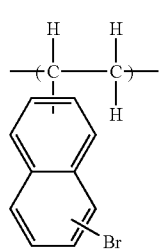

[1-3]

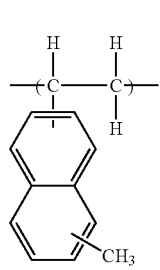

-continued

[1-4]

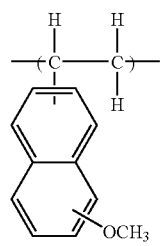

[1-5]

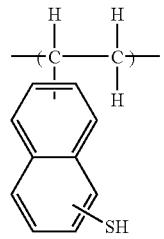

[1-6]

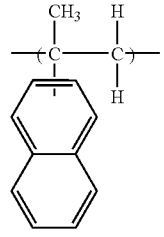

[1-7]

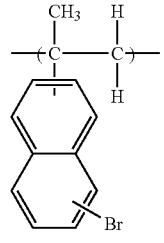

[1-8]

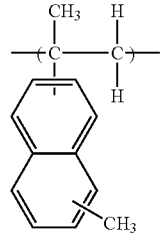

[1-9]

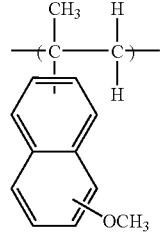

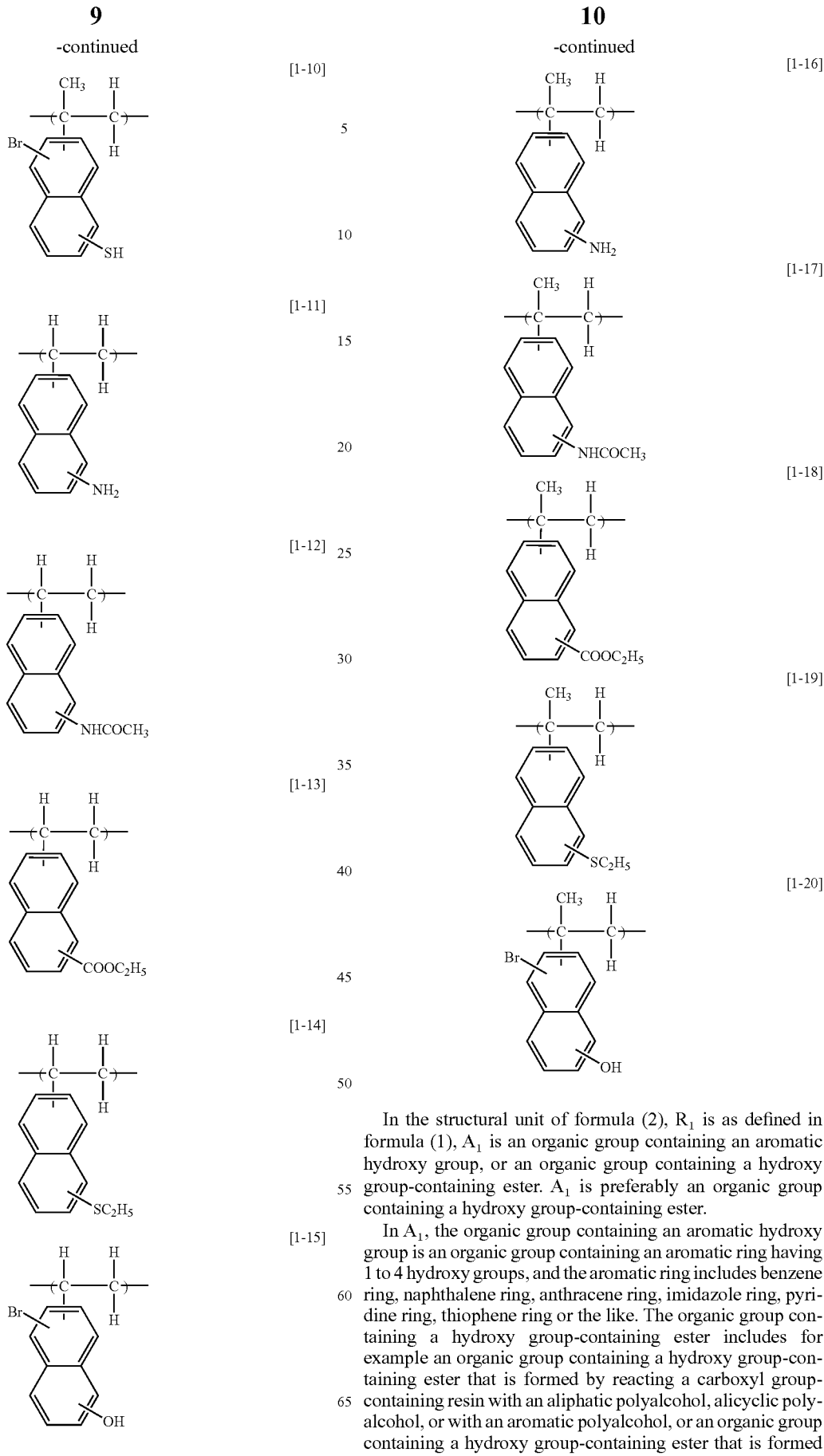

In the structural unit of formula (2), $R_1$ is as defined in formula (1), $A_1$ is an organic group containing an aromatic hydroxy group, or an organic group containing a hydroxy group-containing ester. $A_1$ is preferably an organic group containing a hydroxy group-containing ester.

In $A_1$, the organic group containing an aromatic hydroxy group is an organic group containing an aromatic ring having 1 to 4 hydroxy groups, and the aromatic ring includes benzene ring, naphthalene ring, anthracene ring, imidazole ring, pyridine ring, thiophene ring or the like. The organic group containing a hydroxy group-containing ester includes for example an organic group containing a hydroxy group-containing ester that is formed by reacting a carboxyl group-containing resin with an aliphatic polyalcohol, alicyclic polyalcohol, or with an aromatic polyalcohol, or an organic group containing a hydroxy group-containing ester that is formed by hydrolysis of an epoxy resin obtained by reacting a carboxyl group-containing resin with an epichlorohydrin, or an organic group obtained by reacting an epoxy resin obtained by reacting a carboxyl group-containing resin with an epichlorohydrin, further with an aromatic carboxylic acid or an alicyclic carboxylic acid. The structural unit of formula (2) is preferably 2-hydroxyethylacrylate or 2-hydroxyethylmethacrylate.

As the structural units of formula (2), the followings are exemplified.

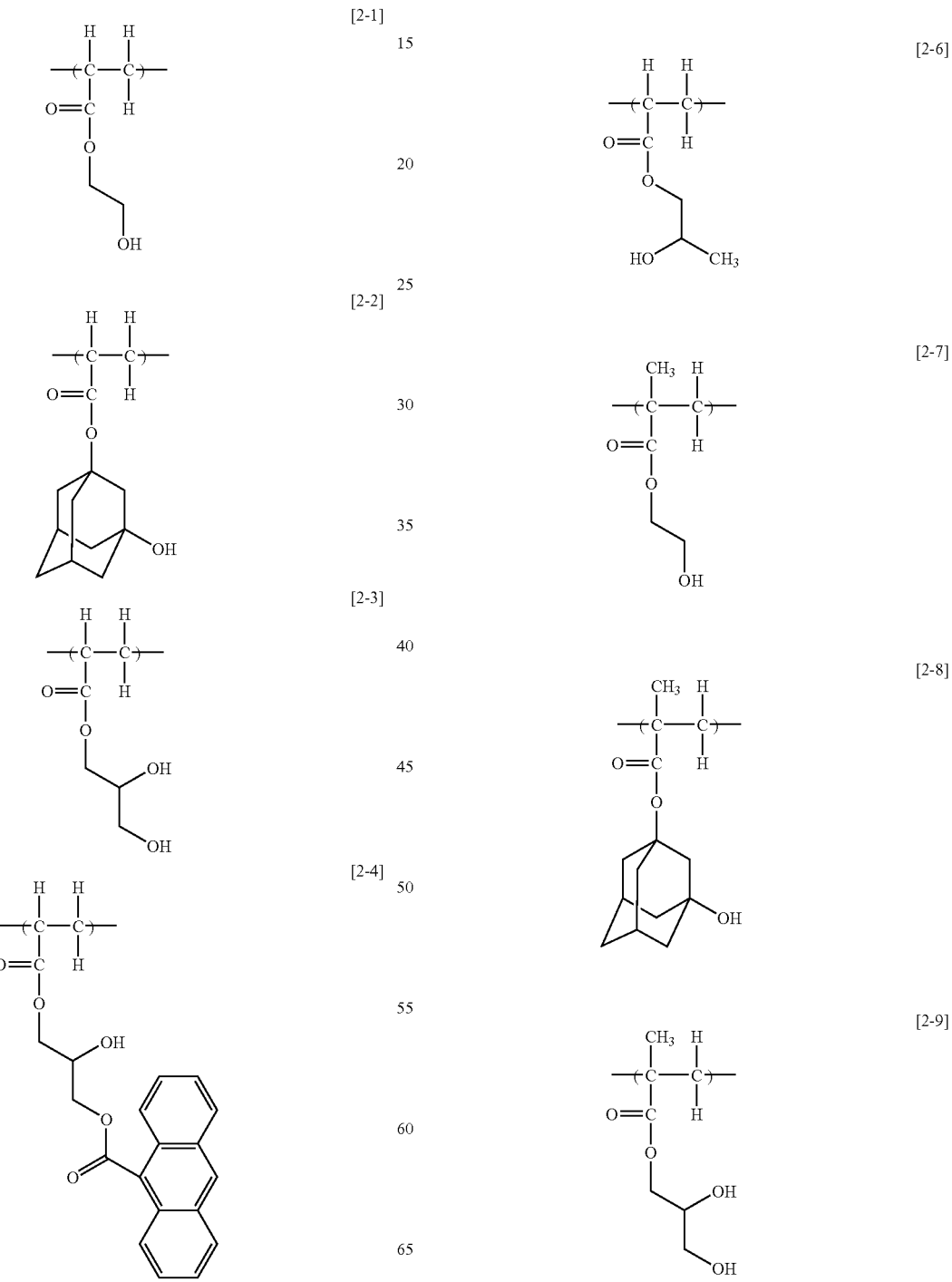

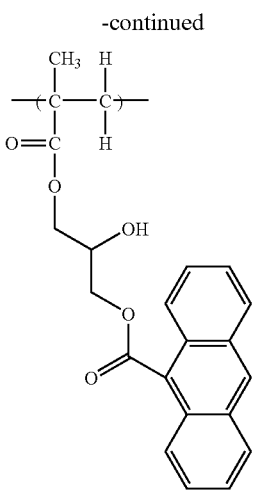
[2-10]

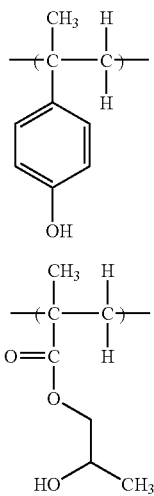
[2-11]

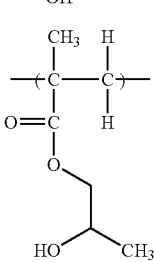
[2-12]

The polymer containing the structural units of formulae (1), (2) and (3) in a molar ratio of 0.02 or more, respectively, based on all structural units constituting the polymer can be used for the coating-type underlayer coating forming composition for lithography. The introduction of the structural unit of formula (3) can control the absorbance of the underlayer coating without a significant lowering of dry etching resistance.

In the polymer containing the structural units of formulae (1), (2) and (3), the sum of molar ratio of each structural unit is 100. It is required that the structural units of formulae (1), (2) and (3) are contained in a molar ratio of 0.02 or more, respectively, based on all structural units constituting the polymer. Other monomers can be copolymerized so long as they are monomers that are copolymerizable with the monomers having the structural units of formulae (1), (2) and (3). In also this case, the sum of molar ratio of each structural unit is 1.00.

The above-mentioned polymers may be block copolymers, alternating copolymers, or random copolymers so long as the polymers have the structural units of formulae (1), (2) and (3) in molar ratio that is required in the total polymer.

The polymer containing the structural unit of formula (1) in a molar ratio of 0.4 to 0.96, the structural unit of formula (2) in a molar ratio of 0.02 to 0.58 and the structural unit of formula (3) in a molar ratio of 0.02 to 0.58, based on all structural units constituting the polymer, can be used.

In the structural unit of formula (3), $R_1$ is as defined in formula (1), $B_1$ is an organic group containing an aliphatic cyclic compound-containing ester, or an organic group containing an aromatic compound-containing ester.

In the substituent $B_1$, the organic group containing an aliphatic cyclic compound-containing ester or an aromatic compound-containing ester is for example an organic group obtained by reacting a carboxyl group-containing resin with an alcohol of an aliphatic cyclic compound or an aromatic compound.

The aliphatic cyclic compound contained in the aliphatic cyclic compound-containing ester includes compounds such as $C_{3-20}$cycloalkane, cycloalkene, norbornene derivative, and adamantane derivative, or the like.

The cycloalkane includes substituted or unsubstituted cyclopropane, cyclobutane, cyclohexane, cyclononane or the like, the cycloalkene includes substituted or unsubstituted cyclopropene, cyclobutene, cyclohexene, cyclononene or the like, the norbornene derivative includes substituted or unsubstituted norbornene, and the adamantane derivative includes substituted or unsubstituted adamantane, diamantane, triamantane, or the like.

In addition, the aromatic compound contained in the aromatic compound-containing ester includes substituted or unsubstituted benzene ring, anthracene ring. The substituents includes the above-mentioned X, and each functional group can be substituted with the substituents up to the maximum number that can be substituted.

As the structural units of formula (3), the followings are exemplified.

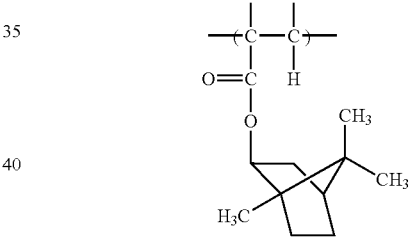
[3-1]

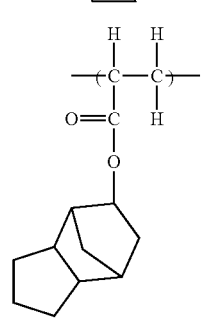
[3-2]

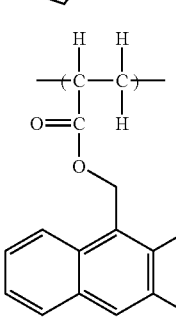
[3-3]

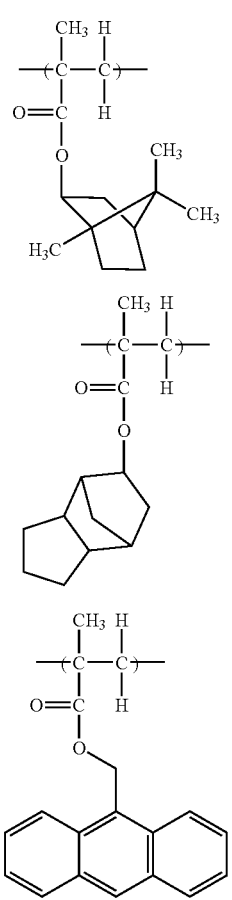

[3-4]

[3-5]

[3-6]

The polymer containing the structural units of formulae (1), (2) and (4) in a molar ratio of 0.02 or more, respectively, based on all structural units constituting the polymer can be used for the coating-type underlayer coating forming composition for lithography. The introduction of the structural unit of formula (4) can control the absorbance of the underlayer coating without a significant lowering of dry etching resistance.

In the polymer containing the structural units of formulae (1), (2) and (4), the sum of molar ratio of each structural unit is 1.00. It is required that the structural units of formulae (1), (2) and (4) are contained in a molar ratio of 0.02 or more, respectively, based on all structural units constituting the polymer. Other monomers can be copolymerized so long as they are monomers that are copolymerizable with the monomers having the structural units of formulae (1), (2) and (4). In also this case, the sum of molar ratio of each structural unit is 1.00.

The above-mentioned polymers may be block copolymers, alternating copolymers, or random copolymers so long as the polymers have the structural units of formulae (1), (2) and (4) in molar ratio that is required in the total polymer.

The polymer containing the structural unit of formula (1) in a molar ratio of 0.4 to 0.96, the structural unit of formula (2) in a molar ratio of 0.02 to 0.58 and the structural unit of formula (4) in a molar ratio of 0.02 to 0.58, based on all structural units constituting the polymer, can be used.

In the structural unit of formula (4). $R_1$ is as defined in formula (1), $B_2$ is a substituted or unsubstituted benzene ring or anthracene ring.

The substituents includes the above-mentioned X, and each functional group can be substituted with the substituents up to the maximum number that can be substituted.

As the structural units of formula (4), the followings are exemplified.

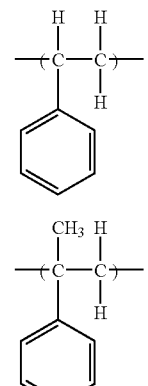

[4-1]

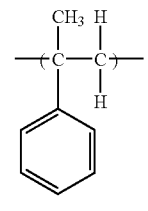

[4-2]

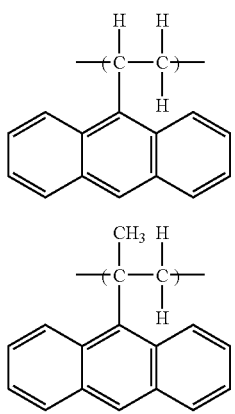

[4-3]

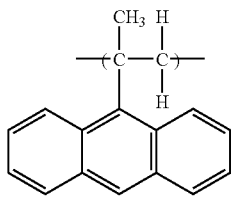

[4-4]

The polymers having the above-mentioned constitution can be exemplified as follows:
the polymer containing the structural units of formulae [1-1] and [2-1] in a proportion of 0.9:0.1 in a molar ratio, based on all structural units constituting the polymer;
the polymer containing the structural units of formulae [1-1] and [2-8] in a proportion of 0.4:0.6 in a molar ratio, based on all structural units constituting the polymer;
the polymer containing the structural units of formulae [1-1] and [2-10] in a proportion of 0.9:0.1 in a molar ratio, based on all structural units constituting the polymer;
the polymer containing the structural units of formulae [1-1], [2-7] and [3-6] in a proportion of 0.4:0.2:0.4 in a molar ratio, based on all structural units constituting the polymer; and
the polymer containing the structural units of formulae [1-1], [2-5] and [4-1] in a proportion of 0.6:0.2:0.2 in a molar ratio, based on all structural units constituting the polymer.

The polymer wherein the structural unit of formula (1) is 2-vinylnaphthalene, or 2-isopropenylnaphthalene, the structural unit of formula (2) is 2-hydroxyacrylate, or 2-hydroxymethacrylate, the structural unit of formula (1) is contained in a molar ratio of 0.9 based on all structural units constituting the polymer, the structural unit of formula (2) is in a molar ratio of 0.1 based on all structural units constituting the polymer, can be preferably exemplified.

It is preferable to crosslink the coating-type underlayer coating forming composition for lithography of the present invention by heating after application in order to prevent any intermixing with photoresists coated thereon, and the coating-type underlayer coating forming composition for lithography of the present invention can contain further a crosslinking agent component. The crosslinking agent includes melamines, substituted ureas, or polymers thereof and the like. The crosslinking agent has preferably at least two crosslink-forming substituents, and are compounds such as methoxymethylated glycoluril, butoxymethylated glycoluril, methoxymethylated melamine, butoxymethylated melamine, methoxymethyl benzoguanamine, butoxymethylbenzoguanamine, methoxymethyl urea, butoxymethyl urea, methoxymethyl thiourea, or methoxymethyl thiourea or the like. In addition, the condensation products of these compounds can be used. The addition amount of the crosslinking agent may vary depending on the coating solvents used, the underlying substrate used, the viscosity of the solvent required, the shape of the coating required, etc., and usually 0.001 to 80% by mass, preferably 0.01 to 50% by mass, further preferably 0.05 to 40% by mass based on the whole solid content. These crosslinking agent may cause a crosslinking reaction due to self-condensation. In a case where any crosslinking substituent is present on the above-mentioned polymer, the crosslinking agent can cause a crosslinking reaction with these crosslinking substituents.

In the present invention, as a catalyst for accelerating the above-mentioned crosslinking reaction, an acidic compound such as p-toluene sulfonic acid, trifluoro methane sulfonic acid, pyridinium p-toluene sulfonic acid, salicylic acid, sulfosalicylic acid, citric acid, benzoic acid, hydroxybenzoic acid, naphthalene carboxylic acid or the like, or/and a thermal acid generator such as 2,4,4,6-tetrabromocyclohexadienone, benzoin tosylate, 2-nitrobenzyl tosylate, other organic sulfonic acid alkyl esters or the like can be added. The addition amount thereof is 0.0001 to 20% by mass, preferably 0.0005 to 10% by mass based on the whole solid content.

In the coating-type underlayer coating forming composition for lithography of the present invention, a photoacid generator can be added in order to conform the acidity of an underlayer coating to that of a photoresist provided on the underlayer coating in lithography process. Preferable photoacid generators are for example onium salt type photoacid generators such as bis(4-t-butylphenyl)iodonium trifluoromethane sulfonate, triphenylsulfonium trifluoromethane sulfonate or the like, halogen-containing compound type photoacid generators such as phenyl-bis(trichloromethyl)-s-triazine or the like, sulfonic acid type photoacid generators such as benzoin tosylate, N-hydroxysuccinimide trifluoro methane sulfonate or the like. The photoacid generators can be added in an amount of 0.2 to 10% by mass, preferably 0.4 to 5% by mass based on the whole solid content.

In the materials for the coating-type underlayer coating of the present invention, further light absorbing agents, rheology controlling agents, adhesion auxiliaries, surfactants or the like can be added, if necessary, in addition to the above-mentioned components.

The further light absorbing agents include for example commercially available light absorbing agents described in "Technique and Market of Industrial Pigments" (CMC Publishing Co., Ltd.) or "Dye Handbook" (edited by The Society of Synthetic Organic Chemistry, Japan), for example C.I. Disperse Yellow 1, 3, 4, 5, 7, 8, 13, 23, 31, 49, 50, 51, 54, 60, 64, 66, 68, 79, 82, 88, 90, 93, 102, 114 and 124; C.I. Disperse Orange 1, 5, 13, 25, 29, 30, 31, 44, 57, 72 and 73; C.I. Disperse Red 1, 5, 7, 13, 17, 19, 43, 50, 54, 58, 65, 72, 73, 88, 117, 137, 143, 199 and 210; C.I. disperse Violet 43; C.I. Disperse Blue 96; C.I. Fluorescent Brightening Agent 112, 135 and 163; C.I. Solvent Orange 2 and 45; C.I. Solvent Red 1, 3, 8, 23, 24, 25, 27 and 49; C.I. Pigment Green 10; C.I. Pigment Brown 2, and the like can be suitably used. The light absorbing agent is generally added in an amount of 10% by mass or less, preferably 5% by mass or less based on the whole solid content of the materials for the coating-type underlayer coating for lithography.

The rheology controlling agents are mainly added in order to increase the flowability of the coating-type underlayer coating forming composition, particularly to increase evenness in film thickness of the coating-type underlayer coating and filling property of the coating-type underlayer coating forming composition in holes, in baking process. Specific examples are phthalic acid derivatives such as dimethyl phthalate, diethyl phthalate, diisobutyl phthalate, dihexyl phthalate, butyl isodecyl phthalate or the like, adipic acid derivatives such as di-n-butyl adipate, diisobutyl adipate, diisooctyl adipate, octyldecyl adipate or the like, maleic acid derivatives such as di-n-butyl maleate, diethyl maleate, dinonyl maleate or the like, oleic acid derivatives such as methyl oleate, butyl oleate, tetrahydrofurfuryl oleate or the like, stearic acid derivatives such as n-butyl stearate, glyceryl stearate, or the like. The rheology controlling agents are added in a proportion of usually less than 30% by mass based on the whole solid content of the materials for the coating-type underlayer coating.

The adhesion auxiliaries are mainly added in order to increase adhesive property between a substrate or a photoresist and a coating-type underlayer coating forming composition, particularly in order not to cause peeling of photoresists in development. Specific examples are chlorosilanes such as trimethylchlorosilane, dimethylvinylchlorosilane, methyl diphenylchlorosilane, chloromethyldimethyl chlorosilane or the like, alkoxysilanes such as trimethylmethoxysilane, dimethyldiethoxysilane, methyldimethoxysilane, dimethylvinylethoxysilane, diphenyldimethoxysilane, phenyltriethoxysilane or the like, silazanes such as hexamethyldisilazane, N,N'-bis(trimethylsilyl)urea, dimethyltrimethylsilylamine, trimethylsilylimidazole or the like, silanes such as vinyltrichlorosilane, γ-chloropropyltrimethoxysilane, γ-aminopropyltriethoxysilane, γ-glycidoxypropyltrimethoxysilane or the like, heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole, mercaptopyrimidine or the like, ureas such as 1,1dimethylurea, 1,3-dimethylurea or the like, or thiourea compounds, etc. The adhesion auxiliaries are added in a proportion of usually less than 5% by mass, preferably 2% by mass based on the whole solid content of the materials for the coating-type underlayer coating for lithography.

In the coating-type underlayer coating material for lithography according to the present invention, surfactants can be added in order not to cause pinholes or striation and in order to further improve coating property to surfaces with unevenness. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc.; polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC 101, SC102, SC103, SC104, SC105, SC106 (manufactured by Asahi Glass Co., Ltd.); organosiloxane polymer KP341 (manufactured by Shinetsu Chemical Co., Ltd.), etc. The blending amount of the surfactants is usually 0.2% by mass or less, preferably 0.1% by mass or less based on the whole solid content of the materials for the coating-type underlayer coating of the present invention. The surfactants may be added singly or in combination of two or more.

Solvents that can be used for dissolving the above-mentioned polymer, crosslinking agent component and crosslinking catalyst and the like in the present invention, include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate or the like. These organic solvents may be used singly or in combination of two or more of them.

Further, high boiling solvents such as propylene glycol monobutyl ether or propylene glycol monobutyl ether acetate, etc. may be mixed and used. Among these solvents, from viewpoint of improvement of leveling property, the following solvents are preferable: propylene glycol monomethyl ether, propylene glycol monomethyl ether acetate, ethyl lactate, butyl lactate, and cyclohexanone, etc.

The photoresist to be coated on the coating-type underlayer coating for lithography in the present invention may be a negative type or a positive type, and includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and Increases the alkali dissolution rate, and a low molecular compound which is decomposed with an acid and increases the alkali dissolution rate of the photoresist, and a photoresist having Si atom in the skeleton, and for example, trade name: APEX-E manufactured by Rhom and Haas Company.

The developer that can be used for the photoresist having coating-type underlayer coating formed by using the coating-type underlayer coating material for lithography of the present invention includes aqueous solutions of alkalis, for example inorganic alkalis such as sodium hydroxide, potassium hydroxide, sodium carbonate, sodium silicate, sodium metasilicate, ammonia water or the like, primary amines such as ethyl amine, n-propyl amine or the like, secondary amines such as diethyl amine, di-n-butyl amine or the like, tertiary amines such as triethyl amine, methyldiethyl amine or the like, alcohol amines such as dimethyl ethanol amine, triethanol amine or the like, quaternary ammonium salts such as tetramethylammonium hydroxide, tetraethylammonium hydroxide, choline or the like, cyclic amine such as pyrrole, piperidine or the like, and so on. Further, alcohols such as isopropyl alcohol or the like, nonionic surfactants or the like can be added and used in these aqueous solution of alkalis. Among them, preferable developers are quaternary ammonium salts, and tetramethyl ammonium hydroxide and choline are more preferable.

Next, the method for forming photoresist pattern according to the present invention is described. On a substrate (for example, transparent substrate such as silicon/silicon dioxide coat substrate, glass substrate, ITO substrate or the like) that is used for the manufacture of precision integrated circuit elements, the coating-type underlayer coating forming composition is coated by a suitable coating method, for example, with a spinner, a coater or the like, and thereafter the substrate is baked to fabricate a coating-type underlayer coating. The film thickness of the coating-type underlayer coating is preferably 0.01 to 3.0 μm. The baking after coating is performed under a condition of a temperature of 80 to 250° C. and a time of 1 to 120 minutes. Good photoresist pattern can be obtained by applying a photoresist directly on the coating-type underlayer coating or on one to some layers of coatings formed on the coating-type underlayer coating if necessary, exposing to light through a predetermined mask, developing, rinsing and drying. If necessary, post exposure bake (PEB) can be also performed. Then, the part of the coating-type underlayer coating that corresponds to the part of the photoresist removed by the above-mentioned development step can be removed by dry etching to form a desired pattern on the substrate.

That is, semiconductor devices can be produced through the following steps: a step of forming a coating-type underlayer coating from the coating-type underlayer coating forming composition on a semiconductor substrate, a step of forming a resist coating thereon, a step of forming a resist pattern by exposure to light and development, a step of etching the coating-type underlayer coating by the resist pattern, and a step of processing the semiconductor substrate by the patterned coating-type underlayer coating.

When miniaturization of resist pattern progresses in future, problems such as a low resolution and collapse of resist pattern after development occur, and thus it is desired to make photoresists thinner. Therefore, it is difficult to obtain a film thickness of resist pattern sufficient for the processing of substrates, and processes for providing a function as a mask in the substrate processing not only for resist pattern but also for coating-type underlayer coating formed between a resist and a semiconductor substrate to be processed become required. As the coating-type underlayer coating for such a process, a coating-type underlayer coating for lithography having a selection ratio of dry etching rate close to that of photoresists, a coating-type underlayer coating for lithography having a lower selection ratio of dry etching rate than that of photoresists, or a coating-type underlayer coating for lithography having a lower selection ratio of dry etching rate than that of semiconductor substrates, which is different from conventional high etch rate coating-type underlayer coatings, becomes required. It is also able to confer anti-reflective performance to the coating-type underlayer coatings, and they can have the function of the conventional anti-reflective coatings together.

On the other hand, for obtaining fine resist pattern, it begins to use a process in which the resist pattern and the coating-type underlayer coating are made thinner on dry etching of coating-type underlayer than the width of pattern on the development of photoresists. As the coating-type underlayer coating for such a process, a coating-type underlayer coating for lithography having a selection ratio of dry etching rate dose to that of photoresists which is different from conventional high etch rate coating-type underlayer coatings, becomes required. It is also able to confer anti-reflective performance to the coating-type underlayer coatings, and they can have the function of the conventional anti-reflective coatings together.

In the present invention, a photoresist can be coated directly on a coating-type underlayer coating formed by the coating-type underlayer coating forming composition of the present invention on a substrate, or on one to some layers of coatings formed on the coating-type underlayer coating if necessary. Therefore, even when a thin photoresist is coated in order to prevent collapse of pattern due to narrow width of photoresist pattern, it make possible to perform the processing of substrates by selecting a suitable etching gas.

That is, semiconductor devices can be produced through the following steps: a step of forming a coating-type underlayer coating from the coating-type underlayer coating forming composition on a semiconductor substrate, a step of forming a hardmask from a coating material containing silicon component or the like thereon, a step of forming a resist coating further thereon, a step of forming a resist pattern by exposure to light and development, a step of etching the hardmask by the resist pattern, a step of etching the coating-type underlayer coating by the patterned hardmask, and a step of processing the semiconductor substrate by the patterned coating-type underlayer coating.

In the present invention, after forming a coating-type underlayer coating of the present invention on a substrate, a siloxane type hardmask can be formed thereon, and further a photoresist can be coated thereon. Therefore, even when a thin photoresist is coated in order to prevent collapse of pattern due to narrow width of photoresist pattern, it make possible to perform the processing of substrates by selecting a suitable etching gas. For example, the processing of hardmask can be carried out by using as an etching gas, chlorine-based gas that has a sufficiently high etching rate compared with the photoresist, and the processing of the coating-type underlayer coating of the present invention can be carried out by using as an etching gas, oxygen-based gas that has a sufficiently high etching rate compared with the hardmask, and further the processing of the substrate can be carried out by using as an etching gas, fluorine-based gas that has a sufficiently high etching rate compared with the coating-type underlayer coating.

The coating-type underlayer coating for lithography containing a naphthalene resin according to the present invention has characteristics that can provide dry etching rate suitable for satisfying these requirements.

Taking into account the effect of the coating-type underlayer coating forming composition for lithography of the present invention as an anti-reflective coating, it does not diffuse into photoresists on drying with heat as the light absorbing moiety is incorporated in the skeleton, and an anti-reflection effect is high as the light absorbing moiety has a sufficiently high light absorption property.

The coating-type underlayer coating forming composition for lithography of the present invention has a high thermal stability, and can prevent contamination on the upper layer coating due to decomposed products on baking and provide a wide temperature margin in baking step.

Further, depending on the processing condition, the coating-type underlayer coating material for lithography of the present invention can be used as a coating having a function of preventing light reflection and a function of preventing an interaction between a substrate and a photoresist, or an adverse effect to the substrate by the material used for the photoresist or substances generated on exposure to the photoresist.

EXAMPLES

Synthetic Example 1

After 35 g (0.227 mol) of 2-vinylnaphthalene and 2.9 g (0.025 mol) of 2-hydroxyethyl acrylate were dissolved in 112 g of cyclohexanone in a flask, the atmosphere in the flask was substituted with nitrogen, and the temperature was raised to 60° C. After the completion of rise in temperature, 1.9 g of azobisisobutyronitrile dissolved in 47 g of cyclohexanone was added under pressure with nitrogen, and reacted with at 60° C. for 24 hours. The reacted solution was cooled and then added into methanol. Thereby a polymer was re-precipitated, and dried with heating to obtain the polymer of formula [5-1]. The resulting polymer had a weight average molecular weight Mw of 12000 (in terms of standard polystyrene).

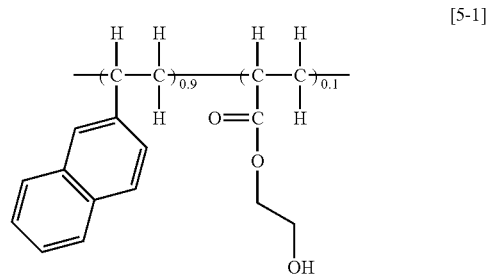

Synthetic Example 2

After 10 g (0.065 mol) of 2-vinylnaphthalene and 23.0 g (0.097 mol) of 3-hydroxy-2-adamantly methacrylate (manufactured by Maruzen Petrochemical, trade name: HAMA) were dissolved in 97 g of cyclohexanone in a flask, the atmosphere in the flask was substituted with nitrogen, and the temperature was raised to 60° C. After the completion of rise in temperature, 1.6 g of azobisisobutyronitrile dissolved in 41 g of cyclohexanone was added under pressure with nitrogen, and reacted with at 60° C. for 24 hours. The reacted solution was cooled and then added into methanol. Thereby a polymer was re-precipitated, and dried with heating to obtain the polymer of formula [5-2]. The resulting polymer had a weight average molecular weight Mw of 16000 (in terms of standard polystyrene).

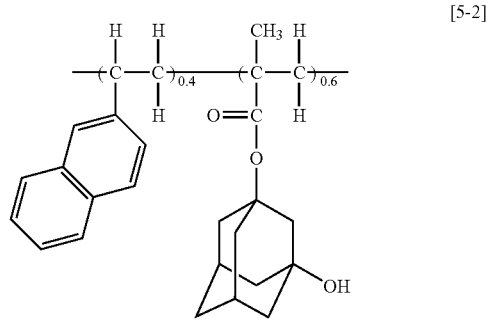

Synthetic Example 3

After 30 g (0.195 mol) of 2-vinylnaphthalene and 3.1 g (0.022 mol) of glycidyl methacrylate were dissolved in 98 g of cyclohexanone in a flask, the atmosphere in the flask was substituted with nitrogen, and the temperature was raised to 60° C. After the completion of rise in temperature, 1.7 g of azobisisobutyronitrile dissolved in 41 g of cyclohexanone was added under pressure with nitrogen, and reacted with at 60° C. for 24 hours. The reacted solution was cooled and then added into methanol. Thereby a polymer was re-precipitated, and dried with heating to obtain the polymer of formula [5-3]. The resulting polymer had a weight average molecular weight Mw of 10000 (in terms of standard polystyrene).

After 15 g of the polymer of formula [5-3] and 2.0 g (0.009 mol) of 9-anthracene carboxylic acid were dissolved in 68 g of cyclohexanone, 0.05 g of benzyltriethyl ammonium chloride was added, and reacted with at 130° C. for 24 hours to obtain a solution containing the polymer of formula [5-4].

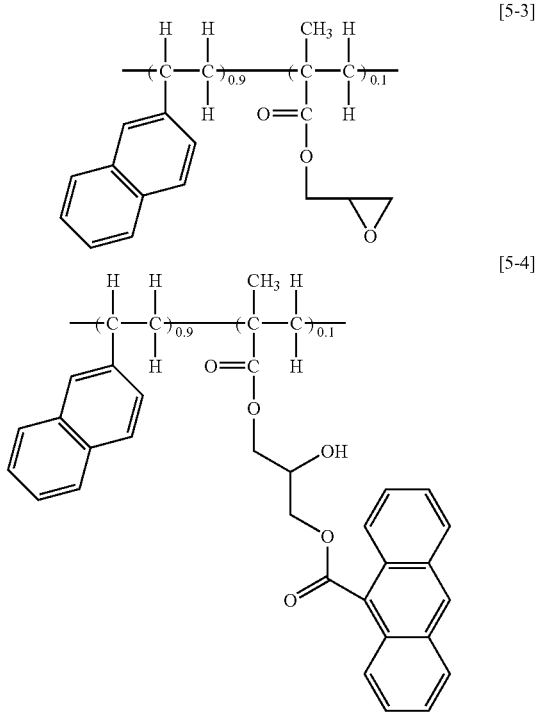

[5-3]

[5-4]

Synthetic Example 4

After 10 g (0.065 mol) of 2-vinylnaphthalene, 17.9 g (0.065 mol) of 9-anthracene methylmethacrylate and 4.2 g (0.032 mol) of 2-hydroxyethyl methacrylate were dissolved in 95 g of cyclohexanone in a flask, the atmosphere in the flask was substituted with nitrogen, and the temperature was raised to 60° C. After the completion of rise in temperature, 1.6 g of azobisisobutyronitrile dissolved in 40 g of cyclohexanone was added under pressure with nitrogen, and reacted with at 60° C. for 24 hours. The reacted solution was cooled and then added into methanol.

Thereby a polymer was re-precipitated, and dried with heating to obtain the polymer of formula [5-5]. The resulting polymer had a weight average molecular weight Mw of 8000 (in terms of standard polystyrene).

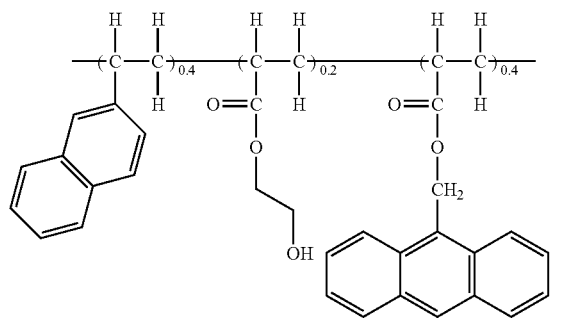

[5-5]

Synthetic Example 5

After 10 g (0.065 mol) of 2-vinylnaphthalene, 2.3 g (0.022 mol) of styrene and 2.6 g (0.022 mol) of p-hydroxystyrene were dissolved in 44 g of cyclohexanone in a flask, the atmosphere in the flask was substituted with nitrogen, and the temperature was raised to 60° C. After the completion of rise in temperature, 0.7 g of azobisisobutyronitrile dissolved in 20 g of cyclohexanone was added under pressure with nitrogen, and reacted with at 60° C. for 24 hours. The reacted solution was cooled and then added into methanol. Thereby a polymer was re-precipitated, and dried with heating to obtain the polymer of formula [5-6]. The resulting polymer had a weight average molecular weight Mw of 12000 (in terms of standard polystyrene).

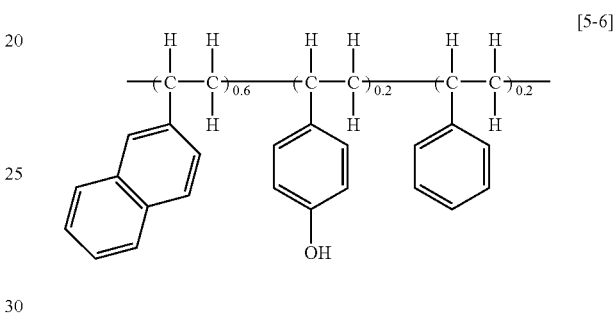

[5-6]

Synthetic Example 6

After 39 g (0.271 mol) of 2-hydroxypropyl methacrylate and 21 g (0.146 mol) of glycidyl methacrylate were dissolved in 211 g of propylene glycol monomethyl ether in a flask, the atmosphere in the flask was substituted with nitrogen, and the temperature was raised to 70° C. After the completion of rise in temperature, 0.6 g of azobisisobutyronitrile dissolved in 30 g of propylene glycol monomethyl ether was added under pressure with nitrogen, and reacted with at 70° C. for 24 hours to obtain the polymer of formula [5-7]. The resulting polymer had a weight average molecular weight Mw of 50000 (in terms of standard polystyrene).

In 100 g of the solution containing 20 g of the polymer of formula [5-7], 10 g (0.045 mol) of 9-anthracene carboxylic acid and 0.3 g of benzyltriethyl ammonium chloride were added, and reacted under reflux with heating to obtain a solution containing the polymer of formula [5-8].

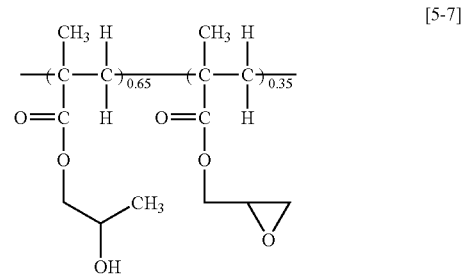

[5-7]

-continued

[5-8]

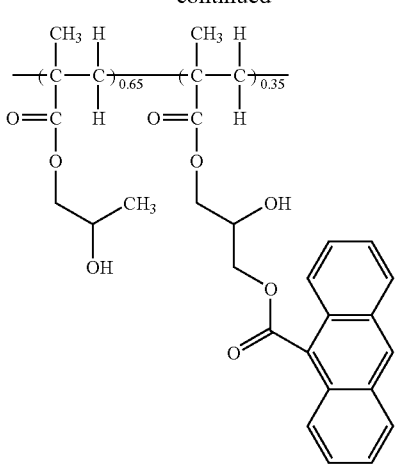

Synthetic Example 7

After 13.2 g (0.092 mol) of hydroxypropyl methacrylate and 6.9 g (0.039 mol) of benzyl methacrylate were dissolved in 71 g of tetrahydrofuran in a flask, the atmosphere in the flask was substituted with nitrogen, and the temperature was raised to 70° C. After the completion of rise in temperature, 0.2 g of azobisisobutyronitrile dissolved in 10 g of tetrahydrofuran was added under pressure with nitrogen, and reacted with at 70° C. for 24 hours to obtain the polymer of formula [5-9]. The resulting polymer had a weight average molecular weight Mw of 70000 (in terms of standard polystyrene).

[5-9]

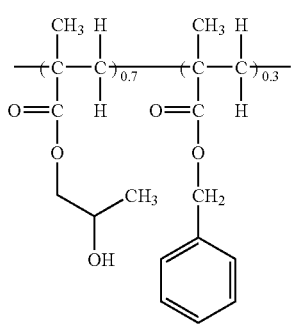

Example 1

In 6 g of the polymer obtained in Synthesis Example 1, 0.5 g of tetrabutoxymethyl glycol uril and 0.05 g of pyridinium p-toluene sulfonic acid were mixed, and dissolved in 126 g of cyclohexanone and 54 g of propylene glycol monomethyl ether to obtain a solution. Thereafter, the solution was filtered through a micro filter made of polyethylene having a pore diameter of 0.10 μm and then through a micro filter made of polyethylene having a pore diameter of 0.05 μm to prepare a solution for coating-type underlayer coating that is used in lithography process by multi-layer.

Example 2

In 6 g of the polymer obtained in Synthesis Example 2, 0.5 g of tetrabutoxymethyl glycol uril and 0.05 g of pyridinium p-toluene sulfonic acid were mixed, and dissolved in 126 g of cyclohexanone and 54 g of propylene glycol monomethyl ether to obtain a solution. Thereafter, the solution was filtered through a micro filter made of polyethylene having a pore diameter of 0.10 μm and then through a micro filter made of polyethylene having a pore diameter of 0.05 μm to prepare a solution for coating-type underlayer coating that is used in lithography process by multi-layer.

Example 3

In cyclohexanone solution containing 6 g of the polymer obtained in Synthesis Example 3, 0.5 g of tetrabutoxymethyl glycol uril and 0.05 g of pyridinium p-toluene sulfonic acid were mixed, and dissolved in 102 g of cyclohexanone and 54 g of propylene glycol monomethyl ether to obtain a solution. Thereafter, the solution was filtered through a micro filter made of polyethylene having a pore diameter of 0.10 μm and then through a micro filter made of polyethylene having a pore diameter of 0.05 μm to prepare a solution for coating-type underlayer coating that is used in lithography process by multi-layer.

Example 4

In 6 g of the polymer obtained in Synthesis Example 4, 0.6 g of tetrabutoxymethyl glycol uril and 0.06 g of pyridinium p-toluene sulfonic acid were mixed, and dissolved in 129 g of cyclohexanone and 55 g of propylene glycol monomethyl ether to obtain a solution. Thereafter, the solution was filtered through a micro filter made of polyethylene having a pore diameter of 0.10 μm and then through a micro filter made of polyethylene having a pore diameter of 0.05 μm to prepare a solution for coating-type underlayer coating that is used in lithography process by multi-layer.

Example 5

In 6 g of the polymer obtained in Synthesis Example 5, 0.6 g of tetrabutoxymethyl glycol uril and 0.06 g of pyridinium p-toluene sulfonic acid were mixed, and dissolved in 129 g of cyclohexanone and 55 g of propylene glycol monomethyl ether to obtain a solution. Thereafter, the solution was filtered through a micro filter made of polyethylene having a pore diameter of 0.10 μm and then through a micro filter made of polyethylene having a pore diameter of 0.05 μm to prepare a solution for coating-type underlayer coating that is used in lithography process by multi-layer.

Comparative Example 1

In 10 g of propylene glycol monomethyl ether solution containing 2 g of the polymer obtained in Synthesis Example 6, 0.5 g of tetramethoxymethyl glycol uril and 0.02 g of p-toluene sulfonic acid were mixed, and dissolved in 37.3 g of propylene glycol monomethyl ether and 19.4 g of propylene glycol monomethyl ether acetate to obtain a solution. Thereafter, the solution was filtered through a micro filter made of polyethylene having a pore diameter of 0.10 μm and then through a micro filter made of polyethylene having a pore diameter of 0.05 μm to prepare a solution for coating-type underlayer coating.

Comparative Example 2

In 10 g of tetrahydrofuran solution containing 2 g of the polymer obtained in Synthesis Example 7, 0.5 g of hexamethoxy methylol melamine and 0.05 g of p-toluene sulfonic acid were mixed, and dissolved in 39.5 g of propylene glycol monomethyl ether to obtain a solution. Thereafter, the solution was filtered through a micro filter made of polyethylene having a pore diameter of 0.10 μm and then through a micro filter made of polyethylene having a pore diameter of 0.05 μm to prepare a solution for coating-type underlayer coating.

Measurement of Optical Parameter

The solutions for coating-type underlayer coating prepared in Examples 1 to 5 or the solutions for coating-type underlayer coating prepared in Comparative Examples 1 and 2 were coated on silicon wafers by means of a spinner. The coated silicon wafers were baked at 205° C. for 1 minute on a hot plate to form coating-type underlayer coatings (film thickness 0.06 μm). On the coating-type underlayer coatings, refractive index (n) and attenuation coefficient (k) at a wavelength of 248 nm or 193 nm were measured with a spectroscopic ellipsometer. The results are shown in Table 1.

Dissolution Test In Photoresist Solvent

The solutions for coating-type underlayer coating prepared in Examples 1 to 5 or the solutions for coating-type underlayer coating prepared in Comparative Examples 1 and 2 were coated on silicon wafers by means of a spinner. The coated silicon wafers were baked at 205° C. for 1 minute on a hot plate to form coating-type underlayer coatings (film thickness 0.10 μm). The coating-type underlayer coatings were dipped in a solvent used for photoresists, for example ethyl lactate, and propylene glycol monomethyl ether, propylene glycol monomethyl ether acetate, cyclohexanone and as a result it was confirmed that the resulting coating-type underlayer coatings were insoluble in these solvents.

Test of Intermixing with Photoresist

The solutions for coating-type underlayer coating prepared in Examples 1 to 5 or the solutions for coating-type underlayer coating prepared in Comparative Examples 1 and 2 were coated on silicon wafers by means of a spinner. The coated silicon wafers were baked at 205° C. for 1 minute on a hot plate to form coating-type underlayer coatings (film thickness 0.10 μm). On each of the coating-type underlayer coatings for lithography was coated a commercially available photoresist solution (trade name: UV113 manufactured by Shipley Corporation or the like) by means of a spinner. The coated wafers were heated at 120° C. for 1 minute on a hot plate. After exposure of the photoresists to light, post exposure bake was performed at 115° C. for 1 minute. After developing the photoresists, the film thickness of the coating-type underlayer coatings was measured and it was confirmed that no intermixing occurred between the coating-type underlayer coatings obtained from the solutions for coating-type underlayer coating prepared in Examples 1 to 5 or the coating-type underlayer coatings obtained from the solutions for coating-type underlayer coating prepared in Comparative Examples 1 and 2 and the photoresist layers.

Measurement of Dry Etching Rate

Etchers and etching gases used for measurement of dry etching rate were as follows:
ES401 (manufactured by Nippon Scientific Co., Ltd.): $CF_4$;
RIE-10NR (manufactured by SAMCO Inc.): $C_4F_8$/Ar, $CHF_3$/Ar;
TCP9400 (manufactured by Lam Research Co., Ltd.): $Cl_2$.

The solutions for coating-type underlayer coating prepared in Examples 1 to 5 or the solutions for coating-type underlayer coating prepared in Comparative Examples 1 and 2 were coated on a silicon wafer by means of a spinner. The coated silicon wafers were baked at 205° C. for 1 minute on a hot plate to form coating-type underlayer coatings (film thickness 0.10 μm). Then, dry etching rate on these underlayer coatings was measured by using $CF_4$ gas as an etching gas. In addition, similarly to the above, a coating was formed on a silicon wafer with a photoresist solution (trade name: UV113 manufactured by Shipley Corporation) by means of a spinner. Then, dry etching rate was measured using $CF_4$ gas as an etching gas, and compared with the dry etching rate of the coating-type underlayer coatings of anti-reflective coatings of Examples 1 to 5 or Comparative Examples 1 and 2. The results are shown in Table 2.

Further, $SiO_2$ coating, SiN coating or Poly-Si coating was used as a coating to be processed on a semiconductor substrate. The dry etching rate of the $SiO_2$ coating on the semiconductor substrate was measured by using $C_4F_8$/Ar gas as an etching gas. On the other hand, similarly to the above, the dry etching rate of the coating-type underlayer coating formed on the silicon wafer was measured by using $C_4F_8$/Ar gas as an etching gas. The rate ratio of the dry etching rate of the $SiO_2$ coating to that of the coating-type underlayer coating is shown in Table 2. The dry etching rate of the SiN coating on the semiconductor substrate was measured by using $CHF_3$/Ar gas as an etching gas. On the other hand, similarly to the above, the dry etching rate of the coating-type underlayer coating formed on the silicon wafer was measured by using $CHF_3$/Ar gas as an etching gas. The rate ratio of the dry etching rate of the SiN coating to that of the coating-type underlayer coating is shown in Table 2.

The dry etching rate of the Poly-Si coating on the semiconductor substrate was measured by using $Cl_2$ gas as an etching gas. On the other hand, similarly to the above, the dry etching rate of the coating-type underlayer coating formed on the silicon wafer was measured by using $Cl_2$ gas as an etching gas. The rate ratio of the dry etching rate of the Poly-Si coating to that of the coating-type underlayer coating is shown in Table 2.

TABLE 1

Refractive Index (n) and Optical Absorption Coefficient (k)

|  | Refractive Index (n) (wavelength 248 nm) | Optical Absorption Coefficient (k) (wavelength 248 nm) |
| --- | --- | --- |
| Example 1 | 2.20 | 0.16 |
| Example 2 | 1.80 | 0.05 |
| Example 3 | 2.07 | 0.27 |
| Example 4 | 1.69 | 0.52 |
| Example 5 | 2.01 | 0.10 |
| Comparative Example 1 | 1.47 | 0.47 |
| Comparative Example 2 | | |

|  | Refractive Index (n) (wavelength 193 nm) | Optical Absorption Coefficient (k) (wavelength 193 nm) |
| --- | --- | --- |
| Example 1 | 1.24 | 0.26 |
| Example 2 | 1.58 | 0.10 |
| Example 3 | 1.28 | 0.25 |
| Example 4 | 1.47 | 0.25 |
| Example 5 | 1.42 | 0.58 |
| Comparative Example 1 | | |
| Comparative Example 2 | 1.82 | 0.34 |

TABLE 2

Dry Etching Rate Ratio

|  | (1) | (2) | (3) | (4) |
| --- | --- | --- | --- | --- |
| Example 1 | 0.8 | 12.1 | 6.4 | 4.9 |
| Example 2 | 0.9 | 7.8 | 5.5 | 4.0 |

TABLE 2-continued

Dry Etching Rate Ratio

| | (1) | (2) | (3) | (4) |
|---|---|---|---|---|
| Example 3 | 0.8 | 11.0 | 6.0 | 4.5 |
| Example 4 | 0.9 | 8.4 | 5.5 | 4.1 |
| Example 5 | 0.8 | 12.5 | 6.6 | 5.0 |
| Comparative Example 1 | 1.3 | 3.7 | 2.8 | 2.0 |
| Comparative Example 2 | 1.4 | 3.4 | 2.5 | 1.8 |

(1) Rate ratio of dry etching rate of coating-type underlayer coating to dry etching rate of resist (coating-type underlayer coating/resist)
(2) Rate ratio of dry etching rate of $SiO_2$ coating to dry etching rate of coating-type underlayer coating ($SiO_2$ coating/coating-type underlayer coating)
(3) Rate ratio of dry etching rate of SiN coating to dry etching rate of coating-type underlayer coating (SiN coating/coating-type underlayer coating)
(4) Rate ratio of dry etching rate of Poly-Si coating to dry etching rate of coating-type underlayer coating (Poly-Si coating/coating-type underlayer coating)

It is found from these results that the coating-type underlayer coating material used for lithography process by multiply coating according to the present invention can provide an excellent coating-type underlayer coating having a selection ratio of dry etching rate close to that of photoresists, or a lower selection ratio of dry etching rate than that of photoresists, or a lower selection ratio of dry etching rate than that of semiconductor substrates which is different from conventional high etch rate anti-reflective coatings, and further being able to have an effect as an anti-reflective coating.

INDUSTRIAL APPLICABILITY

The present invention provides a coating-type underlayer coating for lithography having a selection ratio of dry etching rate close to that of photoresists, a coating-type underlayer coating for lithography having a lower selection ratio of dry etching rate than that of photoresists, or a coating-type underlayer coating for lithography having a lower selection ratio of dry etching rate than that of semiconductor substrates, that causes no intermixing with photoresist layers and provides excellent photoresist pattern. In addition, the coating-type underlayer coating material of the present invention can confer a property for absorbing effectively reflection light from substrates in a case where irradiation light having a wavelength of 248 nm, 193 nm, 157 nm or the like is used in the micro-processing. The composition of the present invention can applied by use of these characteristics to a process in which multi-layer coating for the manufacture of semiconductor devices that require microprocessing with small line width is needed.

The invention claimed is:

1. A method for manufacturing a semiconductor device comprising the steps of:
    forming an underlayer coating on a semiconductor substrate from a coating-type underlayer coating forming composition comprising a polymer containing:
    a structural unit of formula (1):

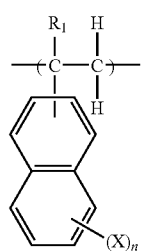

(1)

wherein $R_1$ is a hydrogen atom or a methyl group, X is a halogen atom, an alkyl group, an alkoxy group, a thiol group, a cyano group, a carboxy group, an amino group, an amide group, an alkoxycarbonyl group, or a thioalkyl group on a naphthalene ring, n is an integer of 0 to 7, when n is an integer other than 7, hydrogen atoms are present on residual positions; and
    a structural unit of formula (2):

(2)

wherein $R_1$ is a hydrogen atom or a methyl group. $A_1$ is an organic group containing a p-hydroxy benzene group or a $C_{1-10}$ hydroxyalkyl ester,
    wherein the polymer contains the structural unit of formula (1) in a molar ratio of 0.6 or more and the structural unit of formula (2) in a molar ratio of 0.02 or more, based on all structural units constituting the polymer;
    forming a resist coating on the coating-type underlayer coating;
    forming a resist pattern by exposure to light and development;
    etching the underlayer coating by use of the resist pattern to form a pattern; and
    processing the semiconductor substrate by use of the patterned underlayer coating.

2. The method for manufacturing a semiconductor device according to claim 1, wherein the polymer further comprises a structural unit of formula (3):

(3)

wherein $R_1$ is a hydrogen atom or a methyl group, $B_1$ is an organic group containing an aliphatic cyclic compound-containing ester or an aromatic compound-containing ester, in a molar ratio of 0.02 or more based on all structural units constituting the polymer.

3. The method for manufacturing a semiconductor device according to claim 1, wherein the polymer further comprises a structural unit of formula (4):

(4)

wherein $R_1$ is a hydrogen atom or a methyl group, $B_2$ is a substituted or unsubstituted benzene ring or an anthracene ring, in a molar ratio of 0.02 or more based on all structural units constituting the polymer.

4. The method for manufacturing a semiconductor device according to claim 1, wherein the structural unit of formula (1) is 2-vinylnaphthalene, or 2-isopropenylnaphthalene.

5. The method for manufacturing a semiconductor device according to claim 4, wherein the structural unit of formula (2) is $C_{1-10}$hydroxyalkylacrylate, or $C_{1-10}$hydroxyalkylmethacrylate.

6. The method for manufacturing a semiconductor device according to claim 4, wherein the polymer contains the structural unit of formula (1) in a molar ratio of 0.9 and the structural unit of formula (2) in a molar ratio of 0.1, based on all structural units constituting the polymer.

7. The method for manufacturing a semiconductor device according to claim 1, wherein the structural unit of formula (2) is $C_{1-10}$hydroxyalkylacrylate, or $C_{1-10}$hydroxyalkylmethacrylate.

8. The method for manufacturing a semiconductor device according to claim 1, the coating-type underlayer coating forming composition further comprising a crosslinking compound.

9. The method for manufacturing a semiconductor device according to claim 1, the coating-type underlayer coating forming composition further comprising an acid, an acid generator, or both of them.

10. The method for manufacturing a semiconductor device according to claim 1, the coating-type underlayer coating forming composition further comprising a surfactant.

11. A method for manufacturing semiconductor device comprising the steps of:
forming an underlayer coating on a semiconductor substrate from a coating-type underlayer coating forming composition comprising a polymer containing:
a structural unit of formula (1):

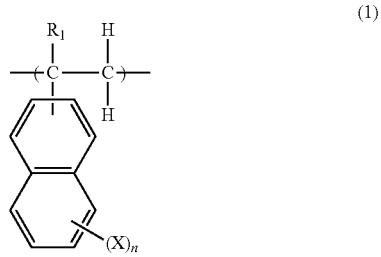

wherein $R_1$ is a hydrogen atom or a methyl group, X is a halogen atom, an alkyl group, an alkoxy group, a thiol group, a cyano group, a carboxy group, an amino group, an amide group, an alkoxycarbonyl group, or a thioalkyl group on a naphthalene ring, n is an integer of 0 to 7, when n is an integer other than 7, hydrogen atoms are present on residual positions; and
a structural unit of formula (2):

wherein $R_1$ is a hydrogen atom or a methyl group, $A_1$ is an organic group containing a p-hydroxy benzene group or a $C_{1-10}$ hydroxyalkyl ester,
wherein the polymer contains the structural unit of formula (1) in a molar ratio of 0.6 or more and the structural unit of formula (2) in a molar ratio of 0.02 or more, based on all structural units constituting the polymer;
forming a hardmask on the coating-type underlayer coating;
forming a resist coating further thereon;
forming a resist pattern by exposure to light and development;
etching the hardmask by use of the resist pattern to form a pattern;
etching the underlayer coating by use of the patterned hardmask to form a pattern; and
processing the semiconductor substrate by use of the patterned underlayer coating.

12. The method for manufacturing a semiconductor device according to claim 11, wherein the polymer further comprises a structural unit of formula (3):

wherein $R_1$ is a hydrogen atom or a methyl group, $B_1$ is an organic group containing an aliphatic cyclic compound-containing ester or an aromatic compound-containing ester, in a molar ratio of 0.02 or more based on all structural units constituting the polymer.

13. The method for manufacturing a semiconductor device according to claim 11, wherein the polymer further comprises a structural unit of formula (4):

wherein $R_1$ is a hydrogen atom or a methyl group, $B_2$ is a substituted or unsubstituted benzene ring or an anthracene ring, in a molar ratio of 0.02 or more based on all structural units constituting the polymer.

14. The method for manufacturing a semiconductor device according to claim 11, wherein the structural unit of formula (1) is 2-vinylnaphthalene, or 2-isopropenylnaphthalene.

15. The method for manufacturing a semiconductor device according to claim 14, wherein the structural unit of formula (2) is $C_{1-10}$hydroxyalkylacrylate, or $C_{1-10}$hydroxyalkylmethacrylate.

16. The method for manufacturing a semiconductor device according to claim 14, wherein the polymer contains the structural unit of formula (1) in a molar ratio of 0.9 and the structural unit of formula (2) in a molar ratio of 0.1, based on all structural units constituting the polymer.

17. The method for manufacturing a semiconductor device according to claim 11, wherein the structural unit of formula (2) is $C_{1-10}$hydroxyalkylacrylate, or $C_{1-10}$hydroxyalkylmethacrylate.

18. The method for manufacturing a semiconductor device according to claim 11, the coating-type underlayer coating forming composition further comprising a crosslinking compound.

19. The method for manufacturing a semiconductor device according to claim 11, the coating-type underlayer coating forming composition further comprising an acid, an acid generator, or both of them.

20. The method for manufacturing a semiconductor device according to claim 11, the coating-type underlayer coating forming composition further comprising a surfactant.

* * * * *